US009584011B1

(12) United States Patent
Puscasu et al.

(10) Patent No.: US 9,584,011 B1
(45) Date of Patent: Feb. 28, 2017

(54) CAPACITIVE COUPLED INPUT TRANSFER GATES

(71) Applicant: SEMICONDUCTOR COMPONENTS INDUSTRIES, LLC, Phoenix, AZ (US)

(72) Inventors: Razvan Puscasu, Targoviste (RO); Radu H. Iacob, Santa Clara, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/148,172

(22) Filed: May 6, 2016

Related U.S. Application Data

(60) Provisional application No. 62/275,427, filed on Jan. 6, 2016.

(51) Int. Cl.
*H02M 3/07* (2006.01)
*H03K 3/354* (2006.01)
*H03K 5/007* (2006.01)

(52) U.S. Cl.
CPC ............. *H02M 3/07* (2013.01); *H03K 3/354* (2013.01); *H03K 5/007* (2013.01)

(58) Field of Classification Search
CPC ...... H02M 2003/071; H02M 2003/072; H03K 5/003; H03K 5/007
See application file for complete search history.

(56) References Cited

U.S. PATENT DOCUMENTS

| 4,812,961 | A | * | 3/1989 | Essaff | ...................... | H02M 3/07 363/61 |
| 4,999,761 | A | * | 3/1991 | Bingham | ................ | H02M 3/07 257/E27.063 |
| 6,400,588 | B1 | * | 6/2002 | Peron | .................... | H02M 7/217 363/60 |
| 7,884,665 | B2 | * | 2/2011 | Saikusa | ................ | H02J 7/0044 307/110 |
| 2013/0154718 | A1 | | 6/2013 | Huijsing et al. | | |

\* cited by examiner

*Primary Examiner* — Jeffrey Zweizig
(74) *Attorney, Agent, or Firm* — Iselin Law, PLLC (57) ABSTRACT

According to one embodiment, an apparatus is for use with a remote circuit. The apparatus has a first input for receiving an input voltage, a second input for receiving a power supply voltage, and a third input for receiving an input clock having a high state corresponding to the power supply voltage and a low state corresponding to a return for the power supply voltage. The apparatus includes a first shift circuit coupled to the first input and the third input, and configured to output a first output clock, the first output clock having a low state corresponding to the input voltage. The apparatus further includes a second shift circuit coupled to the first input and the first shift circuit, and configured to output a second output clock, the second output clock having a high state corresponding to the input voltage.

20 Claims, 13 Drawing Sheets

CAPACITIVE COUPLED INPUT TRANSFER GATES

CROSS-REFERENCE TO RELATED APPLICATION

This application claims priority to U.S. Provisional Application No. 62/275,427, filed on Jan. 6, 2016, entitled "CAPACITIVE COUPLED INPUT TRANSFER GATES," invented by Razvan PUSCASU and Radu H. IACOB, and is incorporated herein by reference and priority thereto for common subject matter is hereby claimed.

BACKGROUND

The present disclosure relates, in general, to electronics and, more particularly, to operational amplifiers (e.g., high voltage precision amplifiers) and level shifters for shifting reference levels of signals for driving input transfer gates.

Precision operational amplifiers may be used to perform signal conditioning (e.g., for analog sensors). In this regard, the amplifiers may perform low voltage amplification and/or bandpass filtering. Additionally, precision operational amplifiers may be used to perform high- or low-side current sensing (e.g., for power management). In this regard, the amplifiers may be included as part of a feedback loop.

In an ideal operational amplifier, a differential input signal is amplified such that the output is 0V when the input signal is 0V. However, in actual devices, an output of 0 volts may result from a non-zero differential input signal that compensates internal voltage or current offsets (mismatches). The non-zero differential input is referred to as the input offset voltage. Architectures used for reducing the input offset voltage include using a chopper amplifier architecture, an auto-zero architecture or different combinations of chopper amplifier and auto-zero architectures.

BRIEF DESCRIPTION OF THE DRAWINGS

The present invention will be better understood from a reading of the following detailed description, taken in conjunction with the accompanying drawing figures, in which.

DETAILED DESCRIPTION

Generally, precision amplifiers (e.g., high voltage precision amplifiers) in accordance with embodiments of the present invention receive clock signals that are shifted from one reference level (e.g., a ground-referenced level) to another reference level (e.g., a user-defined reference level). In shifting the clock signal, attributes of the level-shifted signal (e.g., amplitude, frequency, edge) are preserved in order to facilitate proper operation (e.g., of a chopper or auto-zero architecture).

According to one embodiment, an apparatus is for use with a remote circuit. The apparatus has a first input for receiving an input voltage, a second input for receiving a power supply voltage, and a third input for receiving an input clock having a high state corresponding to the power supply voltage and a low state corresponding to a return for the power supply voltage. The apparatus includes a first shift circuit coupled to the first input and the third input, and configured to output a first output clock, the first output clock having a low state corresponding to the input voltage. The apparatus further includes a second shift circuit coupled to the first input and the first shift circuit, and configured to output a second output clock, the second output clock having a high state corresponding to the input voltage.

According to a further embodiment, the power supply voltage is smaller in magnitude than the input voltage. According to a further embodiment, the first shift circuit includes a capacitor and a diode coupled between the first input and a terminal of the capacitor. According to yet a further embodiment, an anode of the diode is coupled to the first input, and a cathode of the diode is coupled to the terminal of the capacitor. According to yet a further embodiment, the diode is a Schottky diode.

According to yet a further embodiment, the apparatus further includes a refresh circuit configured to charge or discharge the capacitor during a change in the input voltage. The refresh circuit may be further configured to direct charge from the terminal of the capacitor to the return for the power supply voltage. The refresh circuit may be further configured to direct charge from the terminal of the capacitor to the output of the second shift circuit.

According to yet a further embodiment, the second shift circuit includes a capacitor and a diode coupled between the first input and a terminal of the capacitor. According to yet a further embodiment, an anode of the diode is coupled to the first terminal of the capacitor, and a cathode of the diode is coupled to the first input. According to yet a further embodiment, the diode is a Schottky diode.

According to yet a further embodiment, a frequency of the first output clock and a frequency of the second output clock are approximately equal to a frequency of the input clock.

According to yet a further embodiment, a rise time of the first output clock and a rise time of the second output clock are approximately equal to a rise time of the input clock.

According to yet a further embodiment, the first output clock has a high state corresponding approximately to a sum of the input voltage and the power supply voltage.

According to yet a further embodiment, the second output clock has a low state corresponding approximately to a difference between the power supply voltage and the input voltage.

According to yet a further embodiment, the remote circuit includes at least an auto-zero circuit or a chopper circuit.

According to an embodiment, a method includes: receiving, at a first input, an input voltage; receiving, at a second input, a power supply voltage; receiving, at a third input, an input clock having a high state corresponding to the power supply voltage and a low state corresponding to a return for the power supply voltage; outputting, at a first shift circuit coupled to the first input and the third input, a first output clock having a low state corresponding to the input voltage; and outputting, at a second shift circuit coupled to the first input and the first shift circuit, a second output clock having a high state corresponding to the input voltage.

According to a further embodiment, the power supply voltage is smaller in magnitude than the input voltage. According to a further embodiment, a frequency of the first output clock and a frequency of the second output clock are approximately equal to a frequency of the input clock.

According to a further embodiment, a rise time of the first output clock and a rise time of the second output clock are approximately equal to a rise time of the input clock.

According to a further embodiment, at least: the first output clock has a high state corresponding approximately to a sum of the input voltage and the power supply voltage; or the second output clock has a low state corresponding approximately to a difference between the power supply voltage and the input voltage.

A remote circuit (e.g., an auto-zero circuit, a chopper circuit) receives a differential input that corresponds to a common mode input voltage. The remote circuit further receives control signals from a level shifter circuit. The control signals are for controlling input transfer gates of the remote circuit. The input transfer gates, in turn, control transfer of the differential input.

According to various embodiments, the control signals are referenced to the common mode input voltage, the magnitude of which is significantly larger than that of a power supply voltage for providing power to the level shifter circuit. For example, the power supply voltage may be 5V, and the common mode input voltage may be on the order of ±30V. A clock signal that is input to the level shifter circuit is referenced according to the power supply voltage.

Aspects of the disclosure are directed to shifting the clock signal (which is based on the power supply voltage domain) to a different domain (e.g., the common mode input voltage domain). Accordingly, the clock signal can be used to control the input transfer gates of the remote circuit. The shifting is performed such that attributes of the clock signal (e.g., edges, frequency) are not significantly changed. Further, the shifting is performed such that control signals generated based on the clock signal can be used to control devices of different types (e.g., p-channel transistors and n-channel transistors).

Although the input transfer gates are controlled by control signals that are referenced to the input common mode voltage, the current consumed from the input is relatively small (e.g., on the order of nA), serving primarily to charge/discharge storage elements (e.g., capacitors) of the level shifter circuit.

Figure 1:
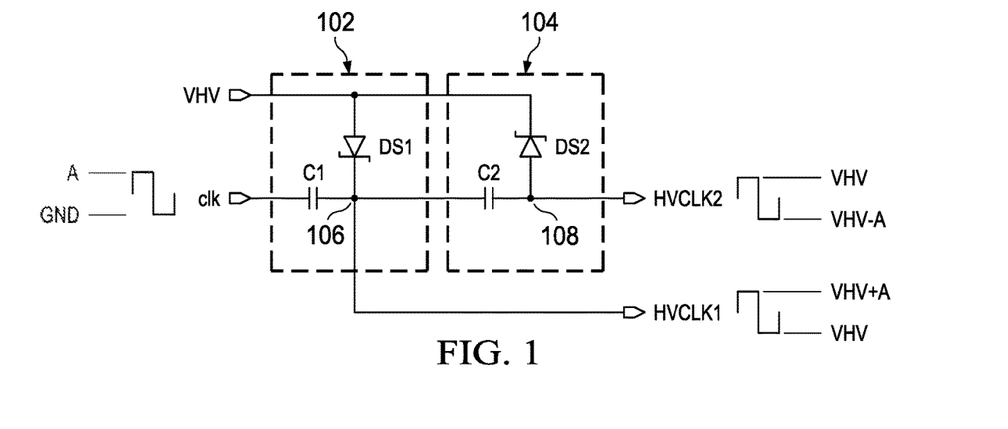
FIG. 1 is a schematic diagram of an embodiment of a circuit for use with a remote circuit.

FIG. 1 is a schematic diagram of an embodiment of a circuit 100 for use with a remote circuit. The circuit 100 includes shift circuits 102, 104. The shift circuits 102, 104 receive a common mode input voltage VHV. The shift circuits 102, 104 also receive a power supply voltage for powering various operations.

The power supply voltage may be generated by a power source that provides power to circuitry. For example, the power source may include a positive voltage rail VDD and a negative voltage rail VSS (e.g., ground). Operations that are powered by the power supply voltage include the generation of a clock signal clk, which is received by the shift circuit 102. The clock signal clk is referenced to the power supply voltage. The clock signal has an amplitude of A Volts that may be equal to or lower than the difference between VDD and VSS.

With continued reference to FIG. 1, the shift circuit 102 includes a capacitor C1 and a Schottky diode DS1. The diode DS1 is coupled between the common mode input voltage VHV and a terminal 106 of the capacitor C1. More particularly, an anode of the diode DS1 is coupled to VHV, and a cathode of the diode is coupled to the terminal 106. DS1 is illustrated as a Schottky diode. However, it is understood that DS1 may be implemented using one or more diodes of another type.

The shift circuit 104 includes a capacitor C2 and a diode DS2 coupled between a terminal 108 of the capacitor C2 and VHV. More particularly, an anode of the diode DS2 is coupled to the terminal 108, and a cathode of the diode DS2 is coupled to VHV. DS2 is illustrated as a Schottky diode. However, it is understood that DS2 may be implemented using one or more diodes of another type.

The shift circuit 102 receives clk and generates an output HVCLK1. The shift circuit 104 receives HVCLK1 and generates an output HVCLK2. The outputs HVCLK1 and HVCLK2 may be used to control input transfer gates of the remote circuit. As will be explained in more detail with reference to FIG. 2, the shift circuit 102 operates similar to a charge pump in generating HVCLK1, and the shift circuit 104 operates similar to an inverted charge pump in generating HVCLK2.

Figure 2:
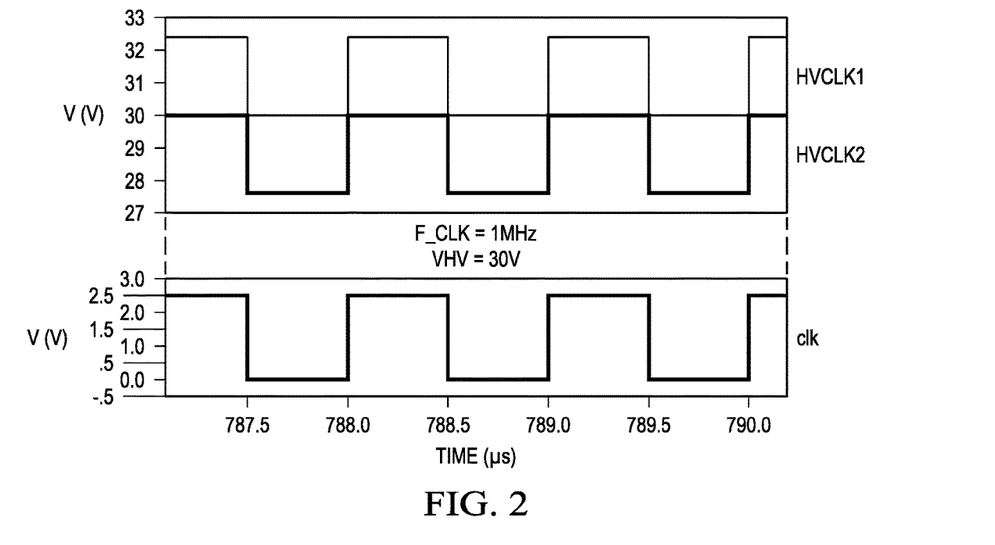
FIG. 2 is an example of a timing diagram associated with the embodiment of FIG. 1.

FIG. 2 is an example of a timing diagram associated with the embodiment of FIG. 1. The timing diagram illustrates an example in which VHV is equal to 30V, and the amplitude of clk (A) is 2.5V. However, it is understood that VHV and/or A may have different values.

With reference to FIGS. 1 and 2, when clk is low (e.g., logic 0), DS1 is forward-biased and conductive. Neglecting the voltage drop across DS1, the voltage at node 106 is equal to VHV (e.g., 30V). This voltage charges C1 such that VHV is applied across C1. The HVCLK1 output (which corresponds to the voltage at node 106) is at VHV potential (e.g., logic low).

The voltage at node 106 also charges C2. Therefore, the voltage at node 108 is equal to (VHV−A) Volts, (e.g., 27.5V). The HVCLK2 output (which corresponds to the voltage at node 108) is at a voltage of (VHV−A) Volts (e.g., logic low). Because the diode DS2 is reverse-biased, DS2 is not conductive.

At its rising edge, clk increases by A Volts, causing the voltage at node 106 to increase from VHV to (VHV+A) Volts (e.g., 32.5V). Therefore, HVCLK1 is at a voltage of (VHV+A) Volts (e.g., logic high). As noted earlier, the voltage drop across C2 is A Volts. Therefore the voltage at node 108 increases from (VHV−A) Volts to VHV Volts (e.g., 30V, or logic high).

The increase in the voltage at node 106 (to (VHV+A) Volts) causes DS1 to become reverse-biased. Accordingly, DS1 becomes non-conductive. Concurrently, the increase in the voltage at node 108 (to VHV Volts) causes DS2 to become forward-biased until the extra charge stored on C2 is discharged to the VHV supply rail.

When clk is high (e.g., logic 1), the voltage at node 106 remains at (VHV+A) Volts (e.g., 32.5V) due to the charge stored on C1 and C2. Therefore, HVCLK1 remains in a logic high state. Neglecting the voltage drop across DS2, the potential at node 108 remains at VHV Volts. Therefore, HVCLK2 remains in a logic high state.

At its falling edge, clk decreases by A Volts, causing the voltage at node 106 to decrease from (VHV+A) Volts (e.g., 32.5V) to VHV Volts. Therefore, HVCLK1 returns to a logic low state (30V). As previously noted, the voltage drop across C2 is A Volts. Therefore the voltage at node 108 decreases from VHV Volts to (VHV−A) Volts, and HVCLK2 returns to a logic low state (27.5V).

As illustrated in FIG. 2, HVCLK1 and HVCLK2 are in phase with clk. The frequencies of HVCLK1 and HVCLK2 are equal to the frequency of clk. For example, the frequencies of all three clock signals may be equal to 1 MHz. As also illustrated in FIG. 2, the clock edges of clk are preserved in the clock edges of the generated clock signals HVCLK1 and HVCLK2. Accordingly, the rise time of clk is equal to the rise times of HVCLK1 and HVCLK2. Similarly, the fall time of clk is equal to the fall times of HVCLK1 and HVCLK2.

Accordingly, in generating HVCLK1 and HVCLK2, a clock signal clk that is referenced to a negative voltage rail VSS (e.g., GND) is effectively shifted to a different reference level (e.g., VHV). Therefore, HVCLK1 and HVCLK2 are referenced to this other reference level.

As illustrated in FIG. 2, HVCLK1 and HVCLK2 may have amplitudes that are equal to the amplitude of clk (e.g., A Volts, or the difference between VDD and VSS). However, it is understood that HVCLK1 and/or HVCLK2 may be generated to have amplitudes larger or smaller than that of clk. For example, the amplitudes of HVCLK1 and HVCLK2 may be defined by appropriately configuring the capacitances C1 and C2, taking also into account the load capacitances that these signals have to drive. Accordingly, the respective amplitudes of HVCLK1 and HVCLK2 may be selectively set by the user, to meet particular driving requirements (e.g., requirements relating to controlling the charge injection phenomenon).

In the example illustrated in FIG. 2, HVCLK1 has a low state corresponding to VHV, and has a high state corresponding to the sum of the VHV and the amplitude of clk (A), which is equal to the power supply voltage. HVCLK2 has a low state corresponding to a difference between VHV and A, and has a high state corresponding to VHV.

According to the example of FIG. 2, the low state of HVCLK1 corresponds to 30V, and the high state of HVCLK1 corresponds to 32.5V. Also, the low state of HVCLK2 corresponds to 27.5V, and the high state of HVCLK2 corresponds to 30V. According to another example, the high/low states of HVCLK1/HVCLK2 may have different values. For example, if the power supply voltage is equal to 5V, the high state of HVCLK1 may correspond to 35V, and the low state of HVCLK2 may correspond to 25V.

The noted differences between HVCLK1 and HVCLK2 may be useful for controlling devices that have different operational characteristics. For example, as will be described in more detail later, HVCLK1 and HVCLK2 may be used to control input transfer gates (e.g., transistors) of a remote device. The transistors controlled by HVCLK1 and HVCLK2, respectively, may be of different types. For example, HVCLK1 may be used to control one or more n-channel MOSFET transistors, and HVCLK2 may be used to control one or more p-channel MOSFET transistors. This feature will be described in more detail later (e.g., with reference to FIG. 11).

The generation of HVCLK1 and HVCLK2 is susceptible to noise on the common mode voltage (VHV) rail. For example, as described earlier, HVCLK1 and HVCLK2 are generated to be referenced to VHV. Transients may appear on the VHV rail, such that, for example, VHV may rise (e.g., momentarily) from 30V to 40V, or fall (e.g., momentarily) from 40V to 25V. Such transient behavior may adversely affect the generation of HVCLK1 and HVCLK2. For example, such transient behavior may adversely affect the degree to which HVCLK1 and HVCLK2 follow VHV. Aspects of the disclosure are directed to refreshing HVCLK1 and HVCLK2 based on the present level of VHV, such that these output signals follow VHV more closely. This refreshing may be performed periodically (e.g., every cycle of clk). Accordingly, the input transfer gates of the remote device can be controlled in a more reliable manner.

Figure 3:
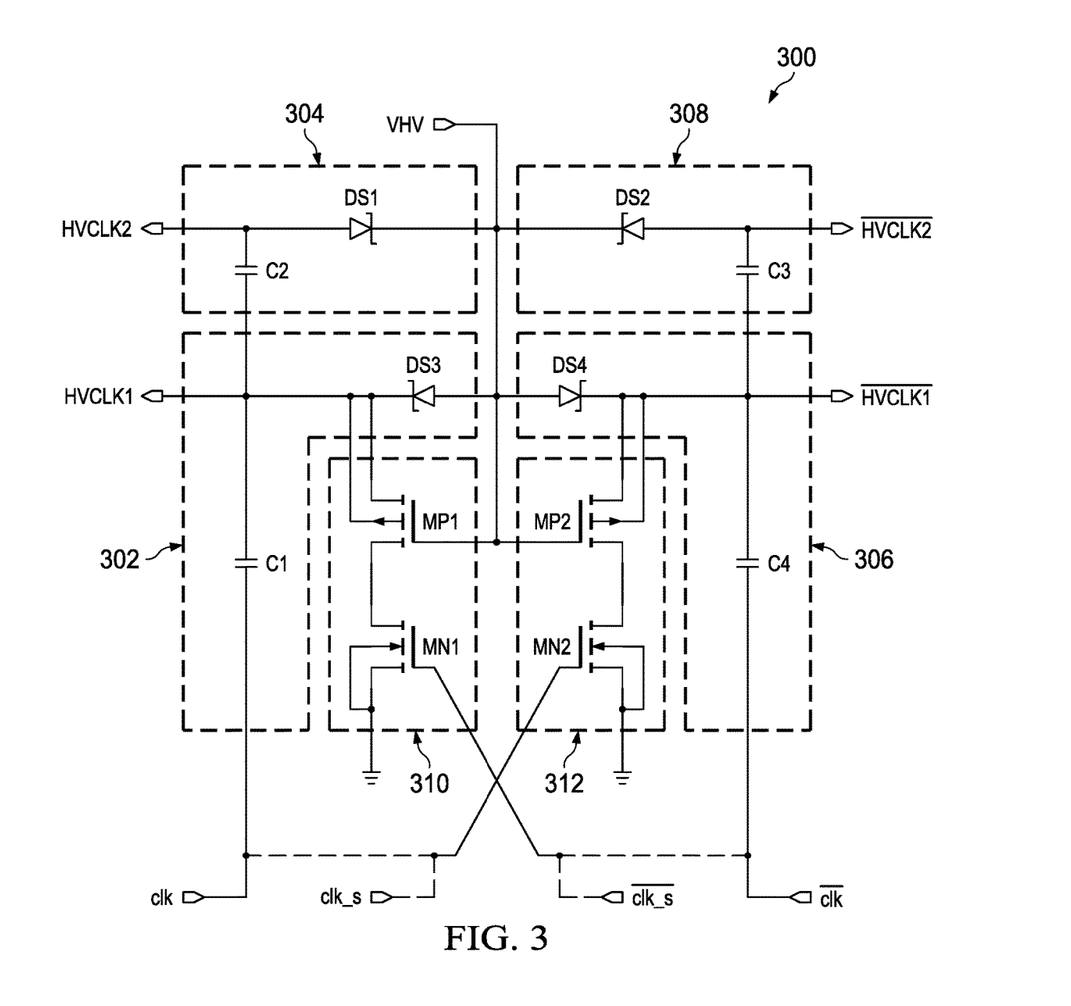
FIG. 3 is a schematic diagram of an embodiment of a circuit for use with a remote circuit.

FIG. 3 is a schematic diagram of an embodiment of a circuit 300 for use with a remote circuit. With reference to FIG. 3, a shift circuit 302 includes a capacitor C1 and a diode DS3. The shift circuit 302 operates in a manner similar to that described earlier with reference to shift circuit 102 of FIG. 1. Also, a shift circuit 304 that includes the capacitor C2 and the diode DS3 operates in a manner similar to that described earlier with reference to shift circuit 104 of FIG. 1.

The circuit 300 further includes shift circuits 306 and 308. The operation of the shift circuit 306 mirrors the operation of the shift circuit 302, and the operation of the shift circuit 308 mirrors the operation of the shift circuit 304. The shift circuit 306 generates the inverse of the HVCLK1 signal generated by the shift circuit 302. In other words, the shift circuit 306 generates $\overline{HVCLK1}$. Similarly, the shift circuit 308 generates the inverse of the HVCLK2 signal generated by the shift circuit 304. In other words, the shift circuit 306 generates $\overline{HVCLK2}$.

The circuit 300 further includes refresh circuits 310, 312. MN1 of refresh circuit 310 is controlled by the input signal $\overline{clk}$. MN2 of refresh circuit 312 is controlled by the input signal clk.

MP1 and MN1 direct the extra charge accumulated on the positive terminal of C1 (illustrated in FIG. 3 as the upper terminal of C1) to ground. As described earlier, the low state of HVCLK1 corresponds to VHV. When the value of VHV changes, e.g., when VHV falls from 30V to 20V, the low state of HVCLK1 should follow the level of VHV. If at least a portion of the charge that is accumulated on C1 is discharged, then HVCLK1 follows VHV more closely. When both MP1 and MN1 are turned on, such charge can be directed to a controlled DC path, e.g., from the positive terminal of C1 to ground. This serves to refresh HVCLK1 to the present level of VHV.

In a similar manner, when both MP2 and MN2 of refresh circuit 312 are turned on, then at least a portion of the extra charge accumulated on C4 can be directed to ground.

As described earlier, MN1 and MN2 are controlled by the signals $\overline{clk}$ and clk, respectively. In this manner, the refreshing of HVCLK1 and HVCLK2 is performed periodically (e.g., every cycle of clk).

Alternatively, the refreshing of HVCLK1 and HVCLK2 may be performed according to a periodic input signal that is different from clk. For example, as illustrated in FIG. 3 (by dotted lines), MN1 and MN2 may be controlled by the signals $\overline{clk\_s}$ and clk_s, respectively.

According to one embodiment, clk_s (or the inverse of clk_s) is a time-delayed version of clk (or the inverse of clk). When MN1 is controlled by $\overline{\text{clk\_s}}$, MN1 is turned on later in time, as compared to the situation in which MN1 is controlled by $\overline{\text{clk}}$.

When the HVCLK1 and HVCLK2 signals are generated in the manner described, the generated outputs become more immune to noise on the common mode voltage (e.g., VHV). For example, as described earlier, the generated clocks are referenced around VHV. When fast transients occur, the outputs HVCLK1 and HVCLK2 are generated to follow VHV. For example, when VHV rises from 30V to 40V, HVCLK1 begins cycling between 40V and 42.5V levels. In this situation, HVCLK2 begins cycling between 37.5V and 40V.

As another example, when VHV falls from 40V to 15V, HVCLK1 begins transitioning between 15V and 17.5V levels, and HVCLK2 begins transitioning between 12.5V and 15V levels. Again, HVCLK1 and HVCLK2 are generated to follow VHV. As such, input transfer gates can still be reliably controlled using HVCLK1 and HVCLK2, even when transient behavior occurs on the VHV rail.

Figure 4:
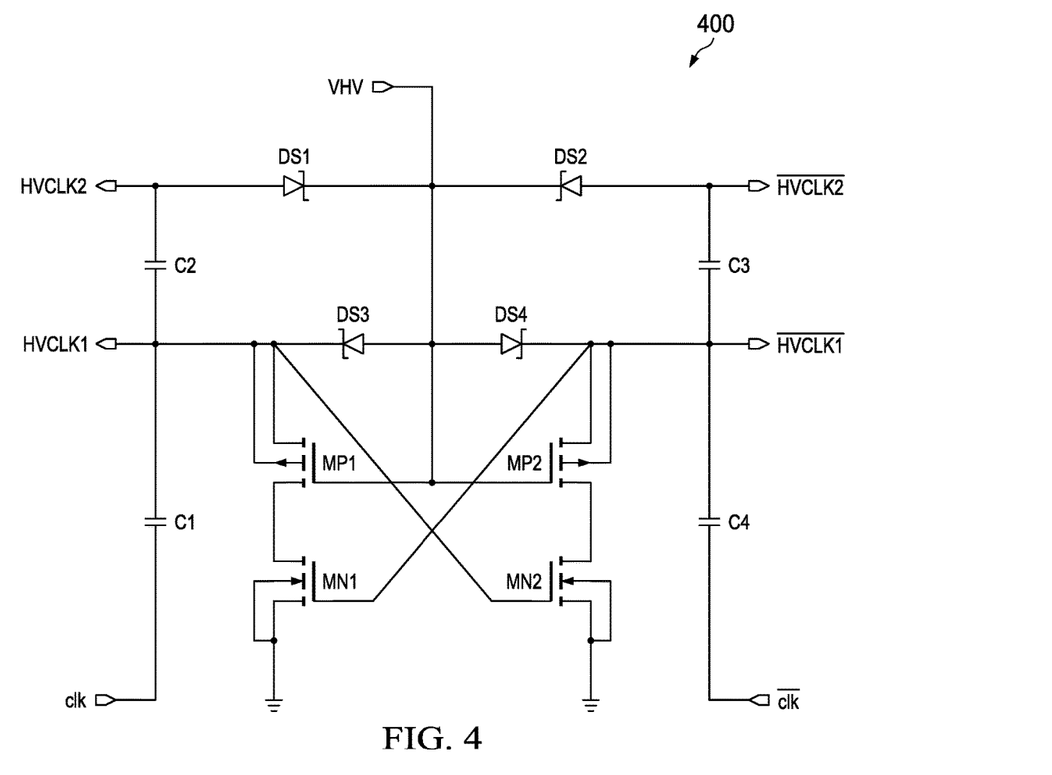
FIG. 4 is a schematic diagram of an embodiment of a circuit for use with a remote circuit.

FIG. 4 is a schematic diagram of an embodiment of a circuit 400 for use with a remote circuit. Similar to the operation of circuit 300, the operation of the circuit 400 also involves refreshing the generation of HVCLK1 and HVCLK2 using controlled DC paths. For example—with reference to FIG. 4, at least a portion of the charge that is accumulated on C1 can be discharged to ground via the transistors MP1 and MN1. Also, at least a portion of the charge that is accumulated on C4 can be discharged to ground via the transistors MP2 and MN2.

Unlike the operation of circuit 300, the transistors MN1 and MN2 are not controlled by input clock signals. Rather—as illustrated in FIG. 4, the transistor MN1 is controlled by the generated signal $\overline{\text{HVCLK1}}$. The transistor MN2 is controlled by the generated signal HVCLK1. According to a particular embodiment, special care is taken so that the circuit operation does not damage the gates of MN1 and MN2.

Figure 5:
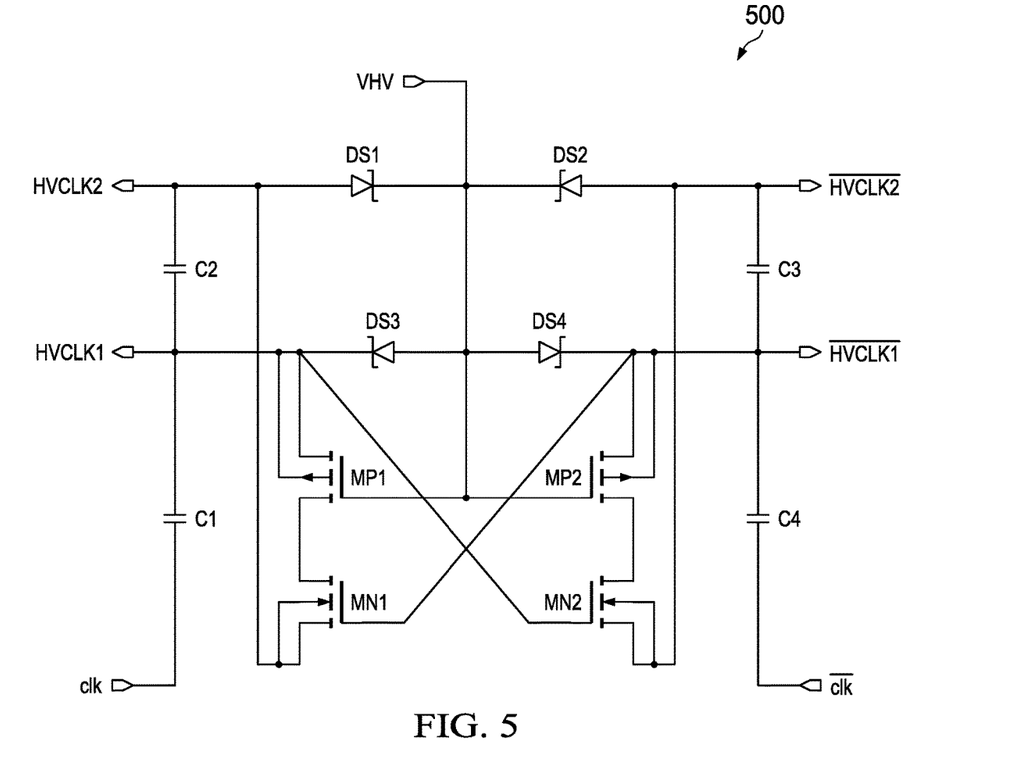
FIG. 5 is a schematic diagram of an embodiment of a circuit for use with a remote circuit.

FIG. 5 is a schematic diagram of an embodiment of a circuit 500 for use with a remote circuit. Similar to the circuits 300 and 400, the circuit 500 generates the outputs HVCLK1, $\overline{\text{HVCLK1}}$, HVCLK2, and $\overline{\text{HVCLK2}}$. Similar to the operation of circuit 400, the transistor MN1 is controlled by the generated signal $\overline{\text{HVCLK1}}$. The transistor MN2 is controlled by the generated signal HVCLK1.

Unlike the operations of circuits 300 and 400, the operation of the circuit 500 involves refreshing the generation of HVCLK1 and HVCLK2 through internal nodes. For example—with reference to FIG. 5, the source terminal of MN1 is coupled to an internal node 502, which is coupled to the HVCLK2 output. As described earlier with reference to FIG. 2, the instantaneous value of HVCLK2 is lower than the instantaneous value of HVCLK1 at all times. Accordingly, at least a portion of the extra charge that is accumulated on C1 can be discharged, via the transistors MP1 and MN1, through DS1 to VHV rail. Similarly, at least a portion of the extra charge that is accumulated on C4 can be discharged, via the transistors MP2 and MN2, through DS2 to VHV rail.

Because the operation of circuit 500 does not involve directing charge to a ground node, circuit 500 may operate in a "floating" manner with reference to an arbitrary potential.

Figure 6:
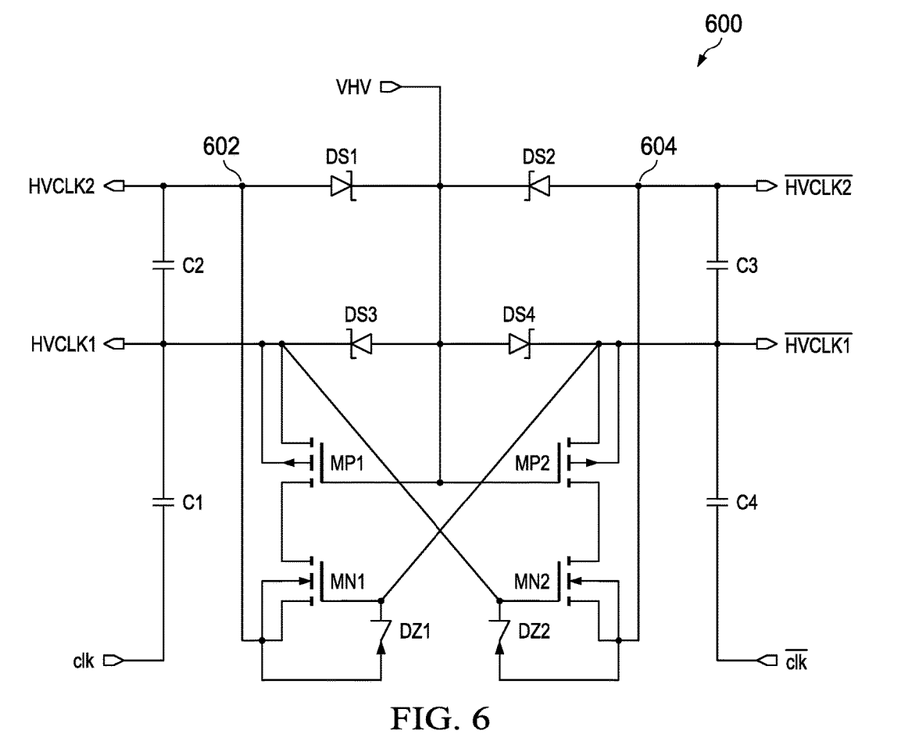
FIG. 6 is a schematic diagram of an embodiment of a circuit for use with a remote circuit.

FIG. 6 is a schematic of an embodiment of a circuit 600 for use with a remote circuit. The configuration of the circuit 600 is similar to that of the circuit 500 of FIG. 5. For example, similar to circuit 600, charge that is accumulated at a positive terminal of a capacitor (e.g., upper terminal of C1, upper terminal of C4 in FIG. 6) can be discharged to an internal node (e.g., nodes 602, 604).

In the circuit 600, the gate terminal and the source terminal of MN1 are coupled to each other through a Zener diode DZ1. The Zener diode DZ1 protects against large variations in VHV (e.g., variations on the order of tens of volts.) If MN1 and MN2 are low-voltage devices, then this protection may be beneficial. It is understood that the protection of MN1 and MN2 can be achieved using other types of diodes.

Similarly, the gate terminal and the source terminal of MN2 are coupled to each other through a Zener diode DZ2. It is understood that the protection of MN2 and MN1 can be achieved using other types of diodes.

Figure 7:
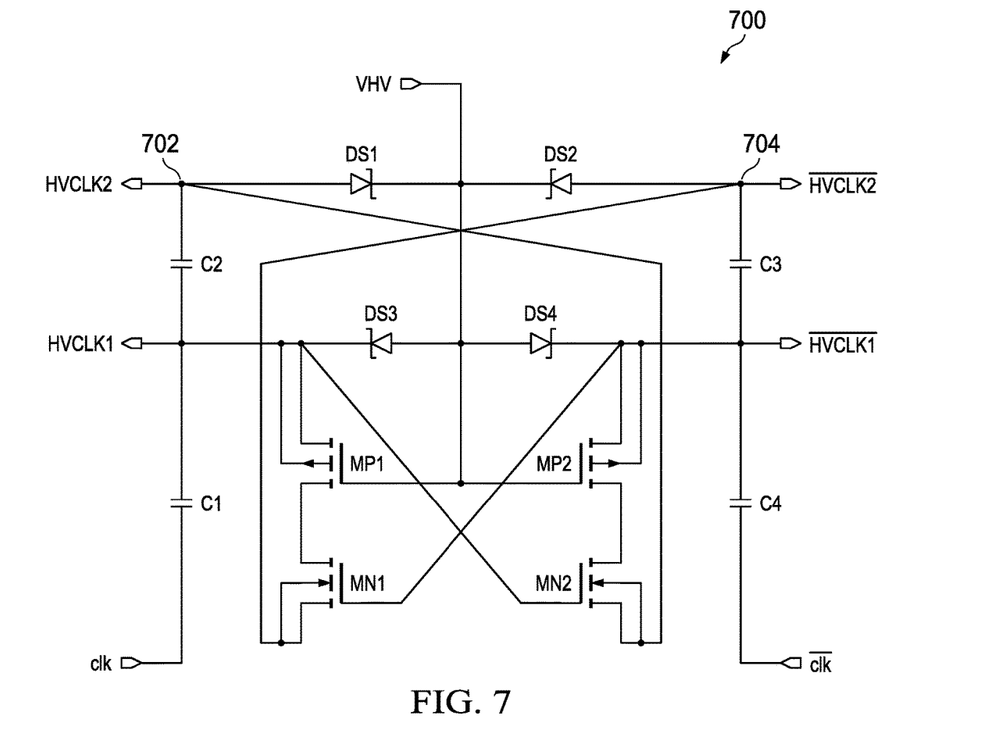
FIG. 7 is a schematic diagram of an embodiment of a circuit for use with a remote circuit.

FIG. 7 is a schematic diagram of an embodiment of a circuit 700 for use with a remote circuit. The configuration of the circuit 700 is similar to that of the circuit 500 of FIG. 5. For example, similar to circuit 500, at least a portion of the extra charge that is accumulated on a capacitor (e.g., C1, C4) can be discharged to an internal node.

However, as illustrated in FIG. 7, the source terminal of MN1 is coupled to an internal node 704, which is coupled to the $\overline{\text{HVCLK2}}$ output. Accordingly, at least a portion of the extra charge that is accumulated on C1 can be discharged, via the transistors MP1 and MN1, to VHV through DS2. Similarly, at least a portion of the extra charge that is accumulated on C4 can be discharged, via the transistors MP2 and MN2, to VHV through DS1.

Figure 8:
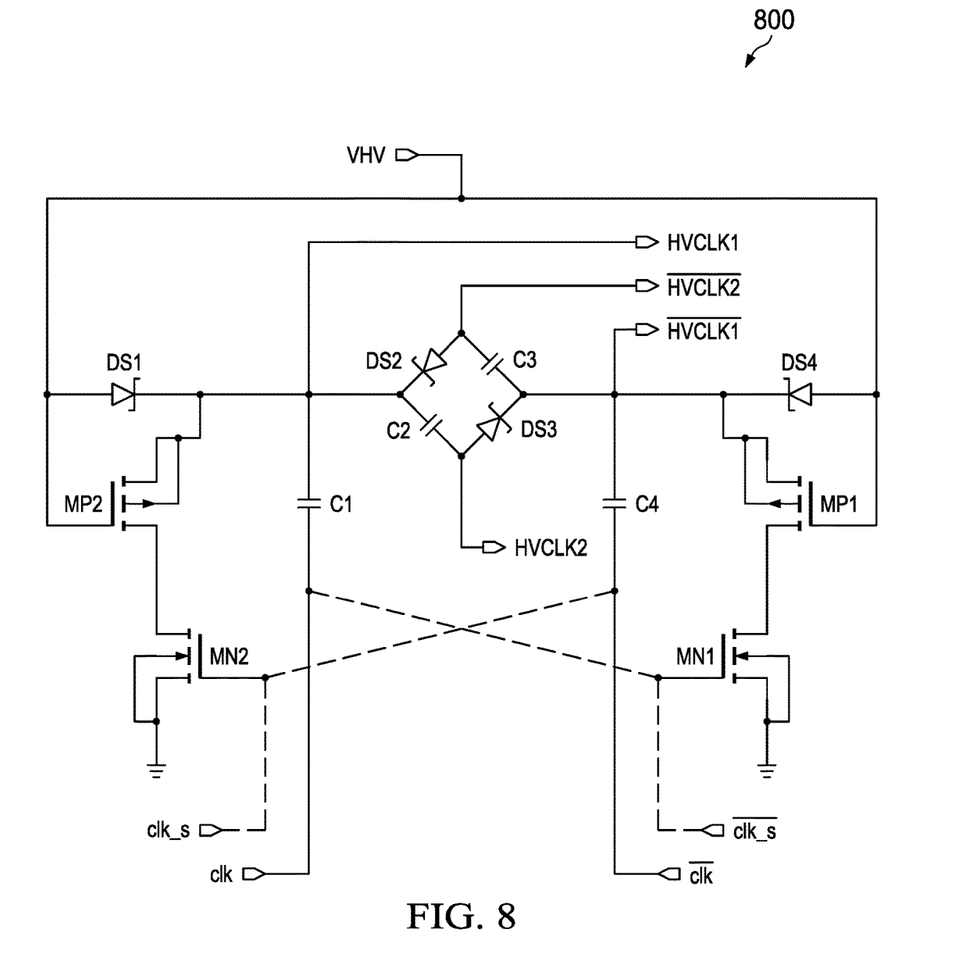
FIG. 8 is a schematic diagram of an embodiment of a circuit for use with a remote circuit.

FIG. 8 is a schematic diagram of an embodiment of a circuit 800 for use with a remote circuit. The operation of circuit 800 involves refreshing the generation of HVCLK1 and HVCLK2 through controlled DC paths and internal nodes. The source of MN2 is coupled to ground. Therefore, when the transistors MN2 and MP2 are on, at least a portion of extra charge that is accumulated on C1 can be discharged to ground. In this embodiment, the refresh is achieved through both internal nodes and controlled DC paths to GND.

As illustrated in FIG. 8, the circuit 800 is similar to circuit 300 of FIG. in that MN2 and MN1 of FIG. 8 are controlled by the signals $\overline{\text{clk}}$ and clk, respectively. Alternatively, as illustrated by dotted lines, MN2 and MN1 may be controlled by the signals $\overline{\text{clk\_s}}$ and clk_s, respectively. According to one embodiment, clk_s (or the inverse of clk_s) is a time-delayed version of clk (or the inverse of clk).

Figure 9:
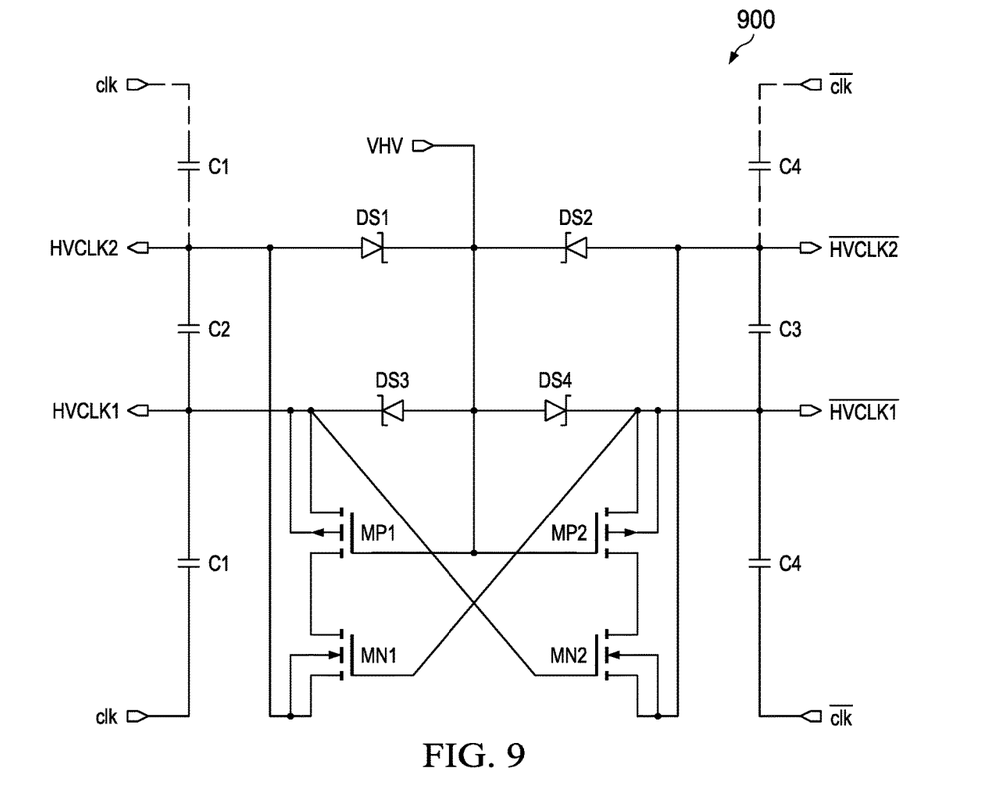
FIG. 9 is a schematic diagram of an embodiment of a circuit for use with a remote circuit.

FIG. 9 is a schematic diagram of an embodiment of a circuit 900 for use with a remote circuit. The circuit 900 is configured to generate outputs that are referenced to positive common mode input voltages. Because the circuit 900 may operating in a floating manner, the circuit is also configured to generate outputs that are referenced to negative common mode input voltages.

As illustrated in FIG. 9, C1 is coupled between the clk input and the HVCLK1 output, and C4 is coupled between the $\overline{\text{clk}}$ input and the $\overline{\text{HVCLK1}}$ output. Alternatively, as also illustrated in FIG. 9 (by dotted lines), C1 may be coupled between the clk input and the HVCLK2 output, and C4 may be coupled between the $\overline{\text{clk}}$ input and the $\overline{\text{HVCLK2}}$ output.

As described earlier with reference to FIGS. 1 and 2, the generated signals HVCLK1 and HVCLK2 may be used to control respective input transfer gates (e.g., transistors) of a remote device. This will be described in more detail with reference to FIG. 10.

Figure 10:
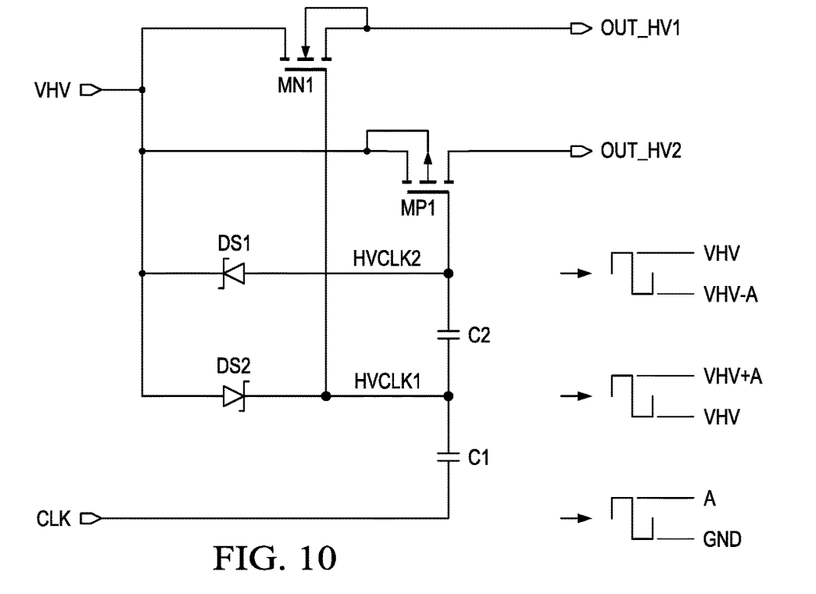
FIG. 10 illustrates controlling of devices according to one embodiment.

FIG. 10 illustrates controlling of transistors according to one embodiment. With reference to FIG. 10, the clock signals HVCLK1 and HVCLK2 are used to control the switching of transistors MN1 and MP1, respectively. The transistors MN1 and MP1 are of two different types. MN1 and MP1 are isolated devices. HVCLK1 is input to the gate of the MN1 transistor. HVCLK2 is input to the gate of the MP1 transistor. MN1 is an n-channel MOSFET transistor, and MP1 is a p-channel MOSFET transistor.

MN1 is switched on (conductive) when HVCLK1 is in a logic high state. In this situation, the potential at the gate of MN1 is higher than the potential at the source of MN1 (which cannot be higher than the voltage at the drain of MN1 (VHV)). When HVCLK1 is in a logic low state, the potential at the gate of MN1 is not higher than the potential at the source MN1. Therefore, MN1 is switched off.

MP1 is switched on (conductive) when HVCLK2 is in a logic low state. The potential at the gate of MP1 is lower than the potential at the source of MP1 (e.g., VHV). When HVCLK2 is in a logic high state, the potential at the gate of MP1 is equal to the potential at the source MP1. Therefore, MN1 is switched off.

Figure 11:
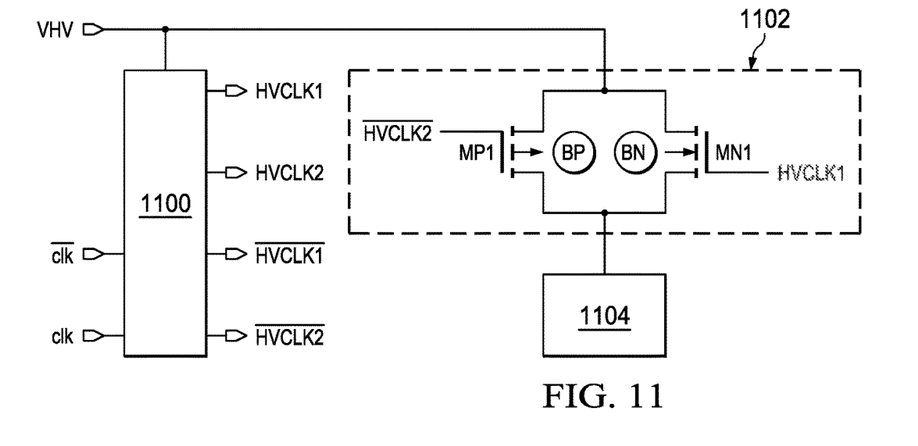
FIG. 11 is a functional block diagram of a level shifter and an input transfer gate according to one embodiment.

FIG. 11 is a functional block diagram of a level shifter 1100 and an input transfer gate 1102 according to one embodiment. The level shifter 1100 receives VHV, clk and $\overline{\text{clk}}$, and generates four outputs: HVCLK1, HVCLK2, $\overline{\text{HVCLK1}}$, and $\overline{\text{HVCLK2}}$. The level shifter 1100 may be implemented using circuits described earlier with reference to various embodiments. For example, the level shifter 1100 may be implemented using any of circuits 300, 400, 500, 600, 700, 800, 900 of FIGS. 3, 4, 5, 6, 7, 8, 9, respectively.

The input transfer gate 1102 includes MP1 and MN1. MP1 is controlled by the output $\overline{\text{HVCLK2}}$ generated by the level shifter 1100. MN1 is controlled by the output HVCLK1 generated by the level shifter 1100. The input transfer gate 1102 controls the transfer of VHV to a load 1104.

With continued reference to FIG. 11, MP1 and/or MN1 may receive a substrate bias, which facilitates a faster switching time as well as lower current consumption. For example, MP1 may receive a substrate bias BP. Alternatively (or in addition), MN1 may receive a substrate bias BN.

Figure 12:
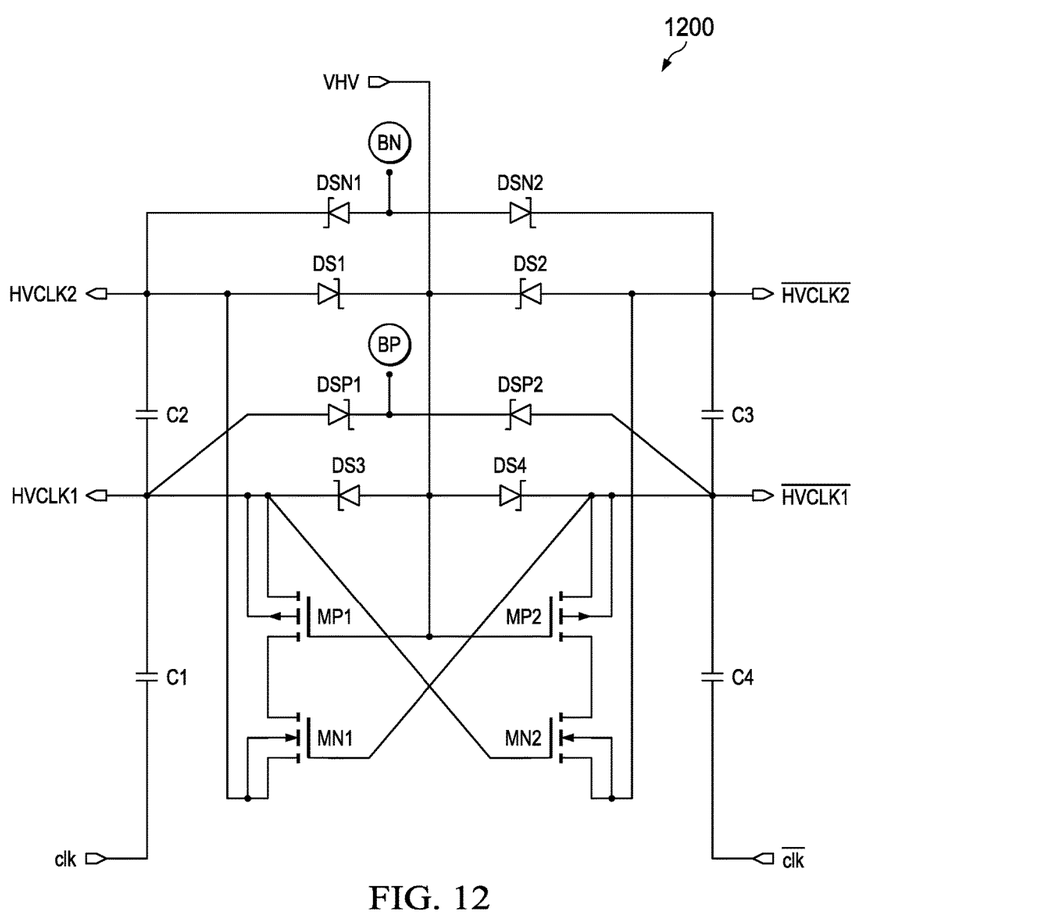
FIG. 12 is a schematic diagram of an embodiment of a circuit for use with a remote circuit.

FIG. 12 is a schematic diagram of an embodiment of a circuit 1200 for use with a remote circuit. The circuit 1200 may be used to implement the level shifter 1100 of FIG. 11.

The circuit 1200 is similar to the circuit 500 described earlier with reference to FIG. 5. Compared to the circuit 500, the circuit 1200 additionally includes a series connection of diodes DSN1 and DSN2 between the HVCLK2 and $\overline{\text{HVCLK2}}$ outputs. The voltage at the anodes of DSN1 and DSN2 provides the substrate bias BN for MN1 of FIG. 11. Further, the circuit 1200 additionally includes a series connection of diodes DSP1 and DSP2 between the HVCLK2 and $\overline{\text{HVCLK2}}$ outputs. The voltage at the anodes of DSP1 and DSP2 provides the substrate bias BP for MP1 of FIG. 11. As illustrated in FIG. 12, the diodes DSN1, DSN2, DSP1, DSP2 are Schottky diodes. However, it is understood that any of the diodes DSN1, DSN2, DSP1, DSP2 may be a diode of another type.

Figure 13:
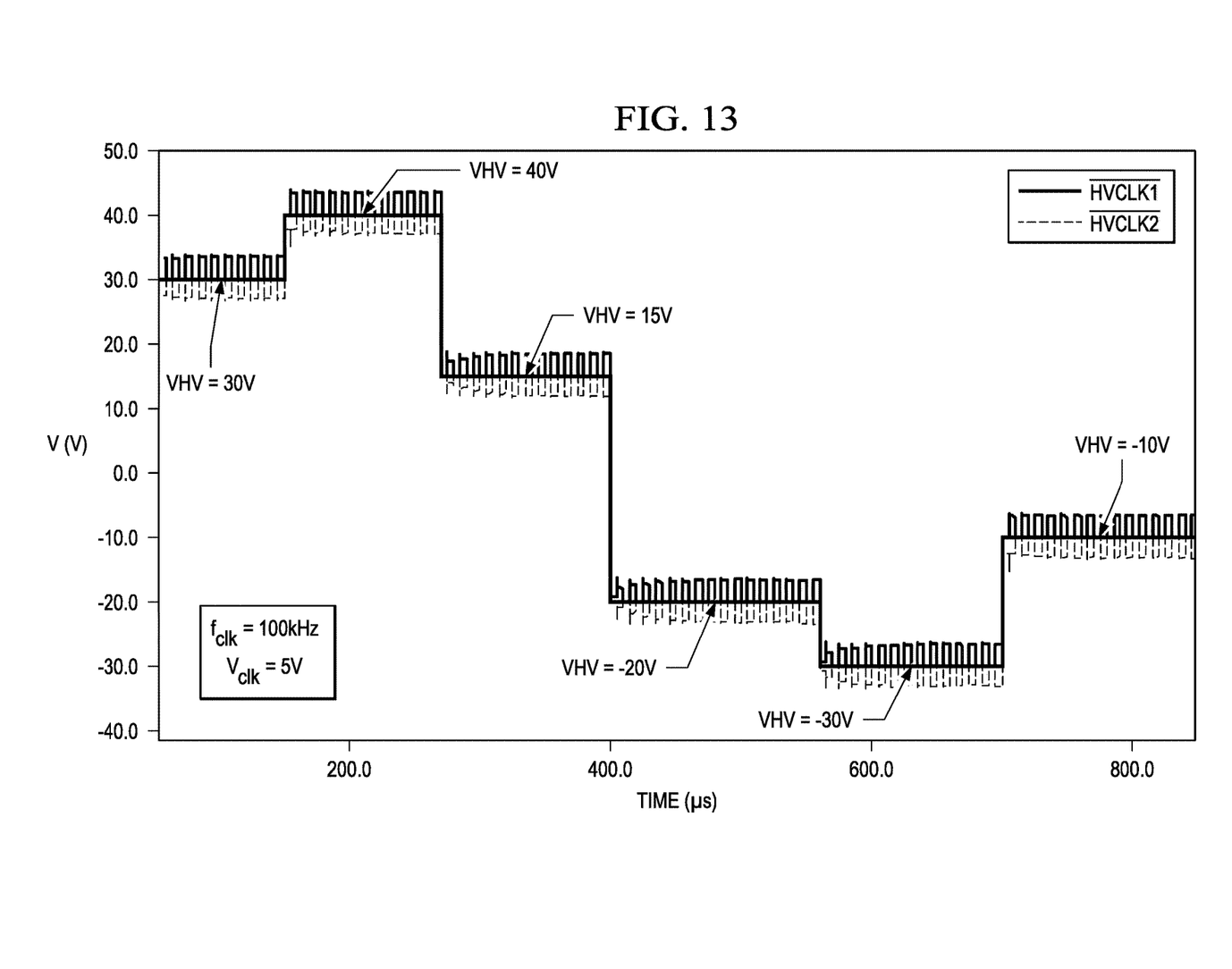
FIG. 13 is an example of a timing diagram associated with the embodiment of FIG. 11.

FIG. 13 is an example of a timing diagram associated with the embodiment of FIG. 11. With reference to FIG. 13, the signals $\overline{\text{HVCLK1}}$ and $\overline{\text{HVCLK2}}$ follow the voltage supplied by the VHV rail, as the voltage varies (e.g., to various voltages ranging from −40V to 40V).

Figure 14:
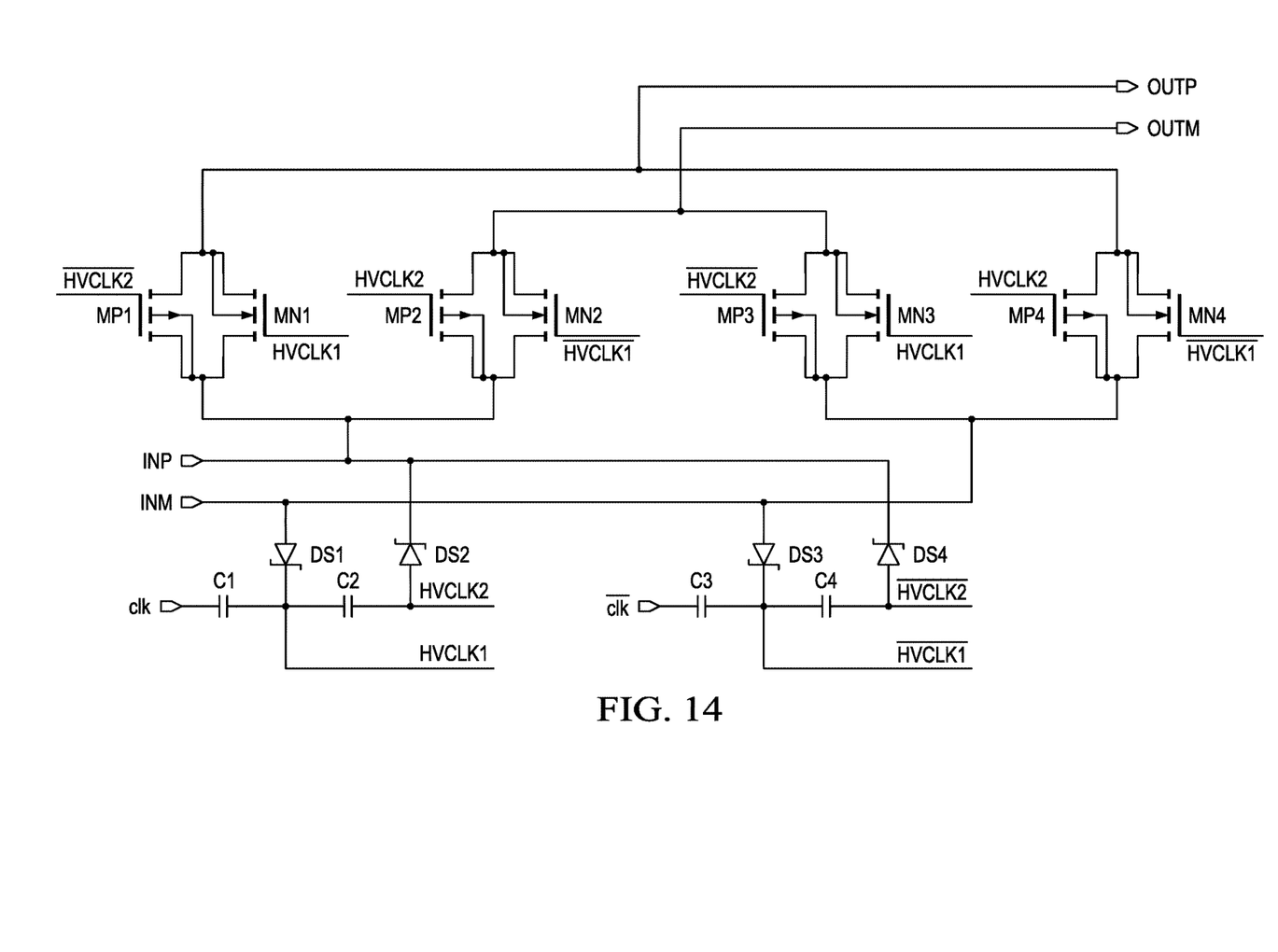
FIG. 14 illustrates controlling of a chopper architecture according to one embodiment.

FIG. 14 illustrates controlling of a chopper architecture according to one embodiment. Input transfer gates are formed by the coupling of MP1 and MN1, the coupling of MP2 and MN2, the coupling of MP3 and MN3, and the coupling of MP4 and MN4. These input transfer gates are controlled by the outputs HVCLK1, HVCLK2, $\overline{\text{HVCLK1}}$, $\overline{\text{HVCLK2}}$ that are generated by a level shifter, as described earlier with reference to various embodiments. For purposes of simplicity, refresh circuits (e.g., circuits similar to circuits 310, 312 of FIG. 3) are not explicitly illustrated in FIG. 14. However, it is understood that the level shifter of FIG. 14 may include such refresh circuits.

Figure 15:
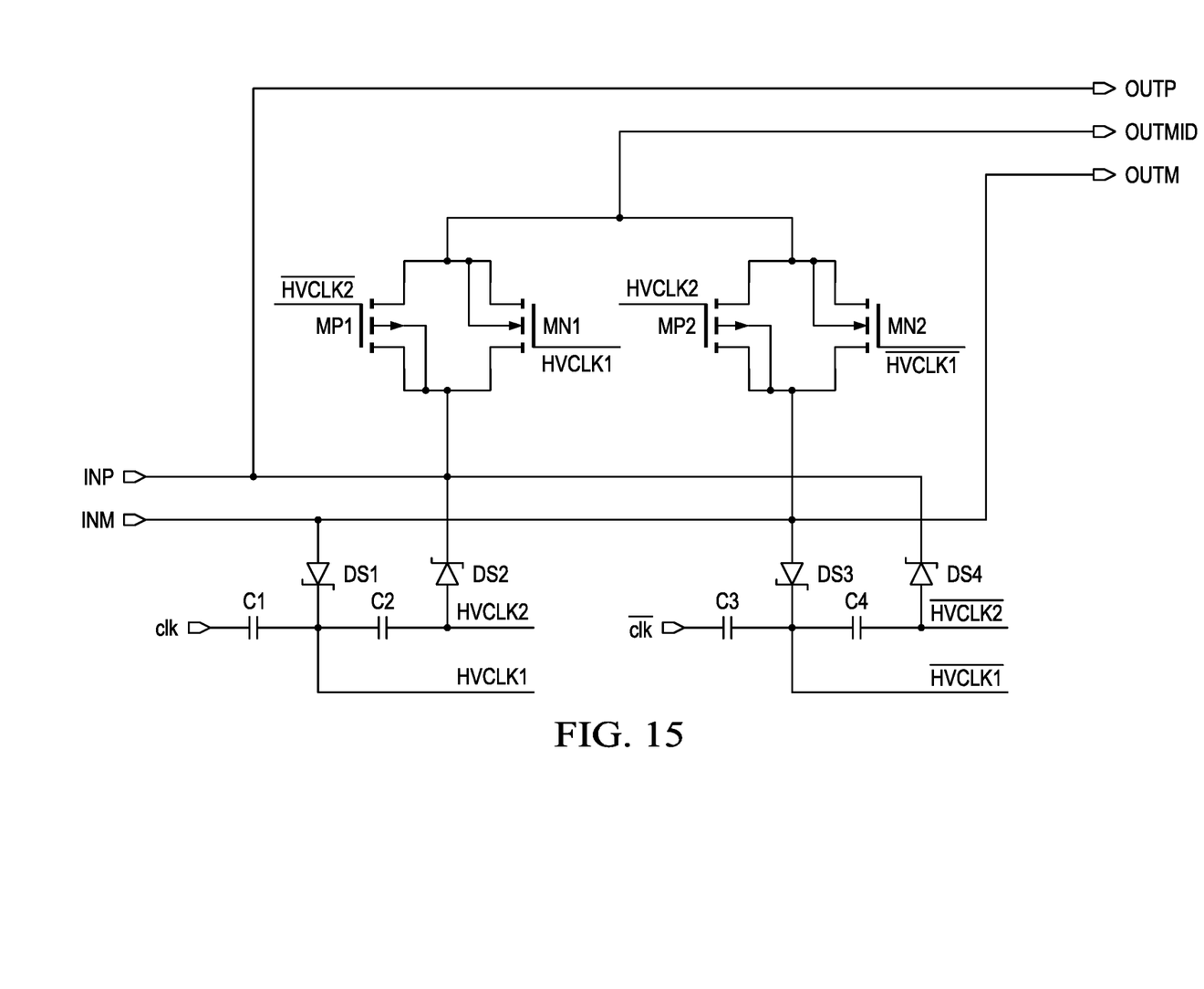
FIG. 15 illustrates controlling of an auto-zero architecture according to one embodiment.

FIG. 15 illustrates controlling of an auto-zero architecture according to one embodiment. Input transfer gates are formed by the coupling of MP1 and MN1 and the coupling of MP2 and MN2. These input transfer gates are controlled by the outputs HVCLK1, HVCLK2, $\overline{\text{HVCLK1}}$, $\overline{\text{HVCLK2}}$ generated by a level shifter, as described earlier with reference to various embodiments. For purposes of simplicity, refresh circuits (e.g., circuits similar to circuits 310, 312 of FIG. 3) are not explicitly illustrated in FIG. 15. However, it is understood that the level shifter of FIG. 15 may include such refresh circuits.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. An apparatus, for use with a remote circuit, having a first input for receiving an input voltage, a second input for receiving a power supply voltage, and a third input for receiving an input clock having a high state corresponding to the power supply voltage and a low state corresponding to a return for the power supply voltage, the apparatus comprising:
   a first shift circuit coupled to the first input and the third input, and configured to output a first output clock, the first output clock having a low state corresponding to the input voltage; and
   a second shift circuit coupled to the first input and the first shift circuit, and configured to output a second output clock, the second output clock having a high state corresponding to the input voltage.

2. The apparatus of claim 1, wherein the first shift circuit comprises:
   a capacitor; and
   a diode coupled between the first input and a terminal of the capacitor.

3. The apparatus of claim 2, wherein:
   an anode of the diode is coupled to the first input; and
   a cathode of the diode is coupled to the terminal of the capacitor.

4. The apparatus of claim 2, wherein the diode is a Schottky diode.

5. The apparatus of claim 2, further comprising a refresh circuit configured to charge or discharge the capacitor during a change in the input voltage.

6. The apparatus of claim 5, wherein the refresh circuit is further configured to direct charge from the terminal of the capacitor to the return for the power supply voltage.

7. The apparatus of claim 5, wherein the refresh circuit is further configured to direct charge from the terminal of the capacitor to the output of the second shift circuit.

8. The apparatus of claim 1, wherein the second shift circuit comprises:
   a capacitor; and a diode coupled between the first input and a terminal of the capacitor.

9. The apparatus of claim 8, wherein:
an anode of the diode is coupled to the first terminal of the capacitor; and
a cathode of the diode is coupled to the first input.

10. The apparatus of claim 9, wherein:
the first shift circuit comprises:
  a second capacitor; and
  a second diode coupled between the first input and a terminal of the second capacitor;
an anode of the second diode is coupled to the first input; and
a cathode of the second diode is coupled to the terminal of the second capacitor.

11. The apparatus of claim 8, wherein the diode is a Schottky diode.

12. The apparatus of claim 1, wherein a frequency of the first output clock and a frequency of the second output clock are approximately equal to a frequency of the input clock.

13. The apparatus of claim 1, wherein a rise time of the first output clock and a rise time of the second output clock are approximately equal to a rise time of the input clock.

14. The apparatus of claim 1, wherein the first output clock has a high state corresponding approximately to a sum of the input voltage and the power supply voltage.

15. The apparatus of claim 1, wherein the second output clock has a low state corresponding approximately to a difference between the power supply voltage and the input voltage.

16. The apparatus of claim 1, wherein the remote circuit comprises at least an auto-zero circuit or a chopper circuit.

17. A method comprising:
receiving, at a first input, an input voltage;
receiving, at a second input, a power supply voltage;
receiving, at a third input, an input clock having a high state corresponding to the power supply voltage and a low state corresponding to a return for the power supply voltage;
outputting, at a first shift circuit coupled to the first input and the third input, a first output clock having a low state corresponding to the input voltage; and
outputting, at a second shift circuit coupled to the first input and the first shift circuit, a second output clock having a high state corresponding to the input voltage.

18. The method of claim 17, wherein a frequency of the first output clock and a frequency of the second output clock are approximately equal to a frequency of the input clock.

19. The method of claim 17, wherein a rise time of the first output clock and a rise time of the second output clock are approximately equal to a rise time of the input clock.

20. The method of claim 17, wherein at least:
the first output clock has a high state corresponding approximately to a sum of the input voltage and the power supply voltage; or
the second output clock has a low state corresponding approximately to a difference between the power supply voltage and the input voltage.

* * * * *